United States Patent
Yoshimi et al.

(12)

(10) Patent No.: US 6,326,304 B1
(45) Date of Patent: Dec. 4, 2001

(54) METHOD OF MANUFACTURING AMORPHOUS SILICON BASED THIN FILM PHOTOELECTRIC CONVERSION DEVICE

(75) Inventors: Masashi Yoshimi; Kenji Yamamoto, both of Kobe (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/390,040

(22) Filed: Sep. 3, 1999

(30) Foreign Application Priority Data

Feb. 26, 1999 (JP) ................................. 11-050152

(51) Int. Cl.⁷ ..................................................... H01L 21/44
(52) U.S. Cl. ............................................. 438/680; 438/681
(58) Field of Search ............................. 438/680, 681, 438/570, 482, 48; 257/13, 16, 52–55

(56) References Cited

U.S. PATENT DOCUMENTS

| 4,933,203 | | 6/1990 | Curtins . | |
|---|---|---|---|---|
| 5,242,505 | * | 9/1993 | Lin et al. | 136/258 |
| 5,262,262 | * | 11/1993 | Yagi et al. | 435/66 |
| 5,646,050 | | 7/1997 | Li et al. . | |
| 5,902,650 | * | 6/1999 | Feng et al. | 427/578 |

FOREIGN PATENT DOCUMENTS

| 62-271418 | 11/1987 | (JP) . |
|---|---|---|
| 05-275346 | 10/1993 | (JP) . |
| 06-005522 | 1/1994 | (JP) . |
| 06-140347 | 5/1994 | (JP) . |
| 7-105354 | 11/1995 | (JP) . |
| 08-306944 | 11/1996 | (JP) . |
| 9-512665 | 12/1997 | (JP) . |
| WO 95/26571 | 10/1995 | (WO) . |

\* cited by examiner

*Primary Examiner*—David Nelms
*Assistant Examiner*—Dung A Le
(74) *Attorney, Agent, or Firm*—Hogan & Hartson, L.L.P.

(57) ABSTRACT

At least one of a p type semiconductor layer, an i type amorphous silicon-based photoelectric conversion layer, and an n type semiconductor layer that compose an amorphous silicon-based thin film photoelectric conversion device is deposited under the following conditions. Silane-type gas as a main component of raw material gas which is supplied into a reaction chamber and dilution gas containing hydrogen are used, the flow rate of the dilution gas is four or less times that of the silane-type gas, the partial pressure of the silane-type gas in the plasma CVD reaction chamber ranges from 1.2 Torr to 5.0 Torr, and the distance between a surface of a substrate mounted on an anode electrode and a surface of a cathode electrode ranges from 8 mm to 15 mm. Accordingly, a method of manufacturing an amorphous silicon-based thin film photoelectric conversion device having a superior performance is obtained with an improved efficiency in the use of raw material gas as well as an enhanced deposition rate to achieve improvements in cost and efficiency in production. Even if the dilution gas is not used, the advantages above can be achieved under the same conditions as those described above except for the condition concerning dilution gas.

7 Claims, 1 Drawing Sheet

METHOD OF MANUFACTURING AMORPHOUS SILICON BASED THIN FILM PHOTOELECTRIC CONVERSION DEVICE

BACKGROUND OF THE INVENTION

1. Field of the Invention

The present invention relates to a method of manufacturing an amorphous silicon-based thin film photoelectric conversion device, and particularly to a method of manufacturing thereof to achieve an excellent performance as an amorphous silicon-based thin film photoelectric conversion device together with improvements in production cost and efficiency.

2. Description of the Background Art

An amorphous silicon based solar cell is a typical thin film photoelectric conversion device. An amorphous photoelectric conversion material is usually prepared by a plasma CVD method at a film-forming temperature as low as about 200° C., so that it can be formed on an inexpensive substrate, e.g., of glass, stainless steel, organic film, and thus expected as a preferable material for low-cost photoelectric conversion devices. Furthermore, since amorphous silicon has a large absorption coefficient for the visible-light range, a solar cell using an amorphous photoelectric conversion layer of a thickness at most 500 nm has achieved a short-circuit current at least 15 mA/cm$^2$.

A p type semiconductor layer, an i type amorphous photoelectric conversion layer, and an n type semiconductor layer that compose the amorphous silicon-based solar cell are usually produced by plasma CVD respectively and the pressure in a conventional plasma CVD reaction chamber is 1 Torr or less.

U.S. Pat. No. 5,646,050, for example, discloses a method of manufacturing an amorphous silicon-based solar cell under a relatively high pressure condition. According to this document, an amorphous silicon layer in the amorphous silicon-based solar cell is fabricated on conditions that the pressure is greater than 1.0 Torr and at most 10 Torr, and the dilution ratio of dilution gas to raw material gas ranges from 5:1 to 200:1.

If the pressure is 1 Torr or less, the deposition rate decreases.

According to the conditions for depositing the amorphous silicon layer disclosed in U.S. Pat. No. 5,646,050, the amount of the dilution gas relative to the raw material gas is excessive. In other words, the amount of the raw material gas relative to the dilution gas is too small. As a result, the amount of the raw material gas supplied into the plasma CVD reaction chamber is insufficient, leading to degradation of the film deposition rate.

SUMMARY OF THE INVENTION

The present invention is made to solve the problems above. One object of the present invention is to provide a method of manufacturing an amorphous silicon-based thin film photoelectric conversion device having an excellent performance and improve the cost and efficiency in production by enhancing the efficiency in the use of raw material gas (ratio of the reacted gas to the total gas which is supplied into the reaction chamber) and increasing the film deposition rate.

According to a method of manufacturing an amorphous silicon-based thin film photoelectric conversion device in one aspect of the invention, the amorphous silicon-based thin film photoelectric conversion device having a stacked structure composed of a p type semiconductor layer, an i type amorphous silicon-based photoelectric conversion layer, and an n type semiconductor layer is fabricated by plasma CVD. The method is characterized in that at least one layer of the p type semiconductor layer, the i type amorphous silicon-based photoelectric conversion layer, and the n type semiconductor layer is formed on conditions that silane-type gas as a main component of raw material gas which is supplied into a plasma CVD reaction chamber as well as dilution gas containing hydrogen are used, the flow rate of the dilution gas is four or less times that of the silane-type gas, the partial pressure of the silane-type gas in the plasma CVD reaction chamber ranges from 1.2 Torr to 5.0 Torr, and the distance between a surface of a substrate mounted on one electrode and a surface of the other electrode opposed to the one electrode hereinafter referred to simply as "distance between electrodes") ranges from 8 mm to 15 mm.

According to the method of manufacturing an amorphous silicon-based thin film photoelectric conversion device in the one aspect of the invention, the conditions of the dilution, pressure, and distance between electrodes are defined to be within predetermined ranges such that plasma can efficiently be confined between the electrodes. Accordingly, the film deposition rate is enhanced and the efficiency in the use of the raw material gas such as silane-type gas is improved to reduce the manufacturing cost of the amorphous silicon-based thin film photoelectric conversion device. Further, a resultant performance is similar to that of the photoelectric conversion device (e.g. solar cell) fabricated by the conventional method, and degradation of the photoelectric conversion property due to exposure to the light over a long period, i.e. the rate of light degradation can be reduced.

The condition that the flow rate of the dilution gas is four or less times that of the silane-type gas is defined in order to prevent reduction in amount of the raw material gas within the reaction chamber and thus prevent decrease in film deposition rate as observed in the conventional method if the flow rate is more than four times.

The condition that the partial pressure of the silane-type gas ranges from 1.2 Torr to 5.0 Torr is defined to avoid an insufficient amount of the raw material gas within the reaction chamber leading to decrease in deposition rate as observed if the partial pressure is less than 1.2 Torr, and prevent generation of a large amount of powder-like products and dust within the reaction chamber as observed if the partial pressure exceeds 5.0 Torr.

The condition that the distance between electrodes ranges from 8 mm to 15 mm is defined to avoid difficulty in plasma discharging and in implementing a constant distance between the electrodes over the electrode surfaces and thus prevent nonuniform deposition over the surfaces as observed if the distance is less than 8 mm. If the distance exceeds 15 mm, discharging cannot be maintained.

According to a method of manufacturing an amorphous silicon-based thin film photoelectric conversion device in another aspect of the invention, the amorphous silicon-based thin film photoelectric conversion device having a stacked structure composed of a p type semiconductor layer, an i type amorphous silicon-based photoelectric conversion layer, and an n type semiconductor layer is fabricated by plasma CVD. The method is characterized in that at least one layer of the p type semiconductor layer, the i type amorphous silicon-based photoelectric conversion layer, and the n type semiconductor layer is fabricated on conditions that silane-type gas as a main component of raw material gas which is supplied into a plasma CVD reaction chamber is used without using dilution gas, the partial pressure of the silane-type gas in the plasma CVD reaction chamber ranges from 1.2 Torr to 5.0 Torr, and the distance between a surface of a substrate mounted on one electrode and a surface of the other electrode opposed to the one electrode ranges from 8 mm to 15 mm.

According to the method of manufacturing an amorphous silicon-based thin film photoelectric conversion device in the another aspect of the invention, plasma can efficiently be confined between the electrodes since the conditions of the dilution, pressure, and distance between electrodes are defined to be within predetermined ranges as the one aspect of the invention discussed above. Consequently, the production cost of the amorphous silicon-based thin film photoelectric conversion device can be reduced since the film deposition rate is improved and the efficiency in the use of the raw material gas such as silane-type gas is enhanced. In addition, a resultant performance is almost similar to that of the photoelectric conversion device produced by the conventional method and the rate of light degradation can be reduced.

Enhancement of the film deposition rate is possible since the dilution gas is not used and a large amount of the raw material gas can be supplied into the reaction chamber.

The partial pressure of the silane-type gas and the distance between electrodes are defined for the same reason as described in the one aspect of the invention.

In the one and another aspects of the invention, the flow rate of the silane-type gas per a unit area of the electrode surface is preferably equal to or less than 0.05 sccm/cm$^2$.

Accordingly, generation of powder-like products and dust in the reaction chamber can be prevented.

In the one and another aspects of the invention, the film deposition rate of the layer formed under the conditions above is preferably 12 nm/min or more.

As a result, the film deposition rate can be improved.

In the one and another aspects of the invention, the one electrode is an anode electrode which is heated during deposition, and the other electrode is a cathode electrode.

Deposition is thus appropriately accomplished using plasma.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
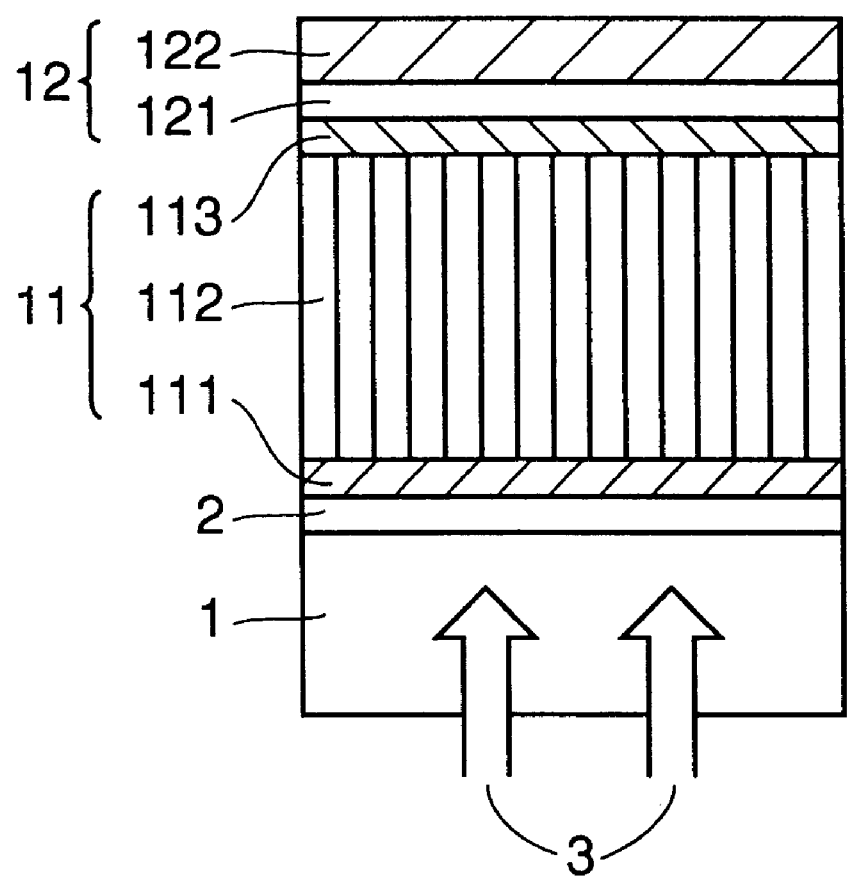
FIG. 1 is a schematic cross sectional view illustrating an amorphous silicon-based thin film photoelectric conversion device fabricated by a method in one embodiment of the invention.

An embodiment of the present invention is hereinafter described in conjunction with the drawing.

Referring to FIG. 1, on a transparent substrate 1 made of glass, for example, a transparent conducting film 2 is deposited. Transparent conducting film 2 is made of SnO$_2$, for example. Instead, transparent conducting film 2 may be made of a transparent conductive oxide film such as ITO and ZnO.

A p type semiconductor layer 111, an i type amorphous photoelectric conversion layer 112, and an n type semiconductor layer 113 are successively formed on transparent conducting film 2. An amorphous photoelectric conversion unit 11 is thus produced.

At least one of p type semiconductor layer 111, i type amorphous photoelectric conversion layer 112 and n type semiconductor layer 113 is formed on conditions that silane-type gas as a main component of raw material gas which is supplied into a plasma CVD reaction chamber and dilusion gas containing hydrogen are used, the flow rate of the dilution gas is four or less times that of the silane-type gas, the partial pressure of the silane-type gas within the plasma CVD reaction chamber ranges from 1.2 Torr to 5.0 Torr, preferably ranges from 1.2 Torr to 3.0 Torr, and the distance between a surface of a substrate placed to closely attach to a heated anode electrode (ground electrode) and a surface of an opposed cathode electrode ranges from 8 mm to 15 mm.

Preferably, the pressure in the plasma CVD reaction chamber ranges from 1.5 Torr to 5.0 Torr.

As p type semiconductor layer 111, a p type amorphous silicon thin film doped with at least 0.01 atomic % of boron which is a conductivity type determining impurity atom may be employed, for example. However, the conditions regarding p type semiconductor layer 111 are not limitations. For example, aluminum may be used as impurity atom and a layer of alloy material such as amorphous silicon carbide or amorphous silicon germanium may be employed.

As i type amorphous photoelectric conversion layer 112, a non-doped i type amorphous silicon thin film or a silicon-based thin film material of weak p or n type containing a slight amount of impurities and having a sufficient photoelectric conversion efficiency may be employed. I type amorphous photoelectric conversion layer 112 is not limited to these materials and a layer of alloy material such as amorphous silicon carbide or amorphous silicon germanium may be used.

As n type semiconductor layer 113, an n type amorphous silicon thin film doped with at least 0.01 atomic % of phosphorus which is a conductivity type determining impurity atom may be used, for example. However, the conditions regarding n type semiconductor layer 113 are not limitations and a layer of alloy material such as amorphous silicon carbide or amorphous silicon germanium may be used.

Although the conditions of deposition are described above in conjunction with the use of dilution gas, silane-type gas may be used as a main component of the raw material gas without using the dilution gas.

The film deposition rate under the conditions above is preferably at least 12 nm/min.

The flow rate of the silane-type gas per a unit area of the opposed electrode surface (cathode electrode surface) under the conditions above is preferably 0.05 sccm/cm$^2$ or less.

In this embodiment, the conditions of the dilution, pressure, and distance between electrodes are defined to be within predetermined ranges such that plasma can efficiently be confined between the electrodes. Consequently, the film deposition rate is enhanced and the efficiency in the use of the raw material gas such as silane-type gas is improved to reduce the manufacturing cost of the amorphous silicon-based thin film photoelectric conversion device. Further, a resultant performance is similar to that of the photoelectric conversion device (e.g. solar cell) fabricated by the conventional method, and degradation of the photoelectric conversion property due to exposure to the light over a long period, i.e. the rate of light degradation can be reduced.

The flow rate of the dilution gas is defined to be four or less times that of the silane-type gas in order to avoid an insufficient amount of the raw material gas within the reaction chamber resulting in decrease in film deposition rate as observed in the conventional method if the rate is more than four times.

The partial pressure of the silane-type gas is defined to be at least 1.2 Torr so as to avoid an insufficient amount of the raw material gas within the reaction chamber leading to decrease in film deposition rate as observed if the partial pressure is less than 1.2 Torr. The partial pressure of the silane-type gas is defined to be equal to or less than 5.0 Torr so as to prevent generation of a large amount of powder-like products and dust within the reaction chamber if the partial pressure exceeds 5.0 Torr.

The distance between electrodes is defined to be at least 8 mm in order to avoid difficulty in plasma discharging and implement a constant distance between the electrodes over the electrode surfaces and thus avoid nonuniform deposition over the surfaces as observed if the distance is less than 8 mm. The distance is defined to be equal to or less than 15 mm since discharging cannot be maintained if the distance exceeds 15 mm.

The result of experiments conducted in this embodiment is now described.

EXPERIMENTAL EXAMPLE 1

An amorphous silicon solar cell having the structure shown in FIG. 1 was fabricated. Glass was used as a substrate 1, and $SnO_2$ was used as a transparent conducting film 2. By plasma CVD, a boron-doped p type amorphous silicon carbide (a-SiC) layer 111, a non-doped amorphous silicon photoelectric conversion layer 112, and a phosphorus-doped n type amorphous silicon layer 113 were deposited to thicknesses of 10 nm, 350 nm, and 20 nm respectively. An amorphous silicon photoelectric conversion unit 11 having a p-i-n junction was thus produced. As a backside electrode 12, a ZnO film 121 and an Ag film 122 were deposited to thicknesses of 80 nm and 300 nm respectively by sputtering.

Amorphous silicon photoelectric conversion layer 112 was deposited by diode parallel plate plasma enhanced CVD, on conditions that the temperature of an underlayer was 200° C., the pressure in the reaction chamber was 2.0 Torr, the flow rate of silane gas per a unit electrode area was 0.03 $sccm/cm^2$, the flow rate of hydrogen gas per unit electrode area was 0.015 $sccm/cm^2$ (the ratio in flow rate between silane gas and hydrogen gas was 2:1, the partial pressure of the silane gas was 1.33 Torr), the discharge power density was 40 $mW/cm^2$, and the film deposition rate was 20 nm/min.

When light 3 with a quantity of AM 1.5, 100 $mW/cm^2$ was made incident onto the amorphous silicon solar cell, the efficiency of photoelectric conversion was 10.1% After the light with a quantity of AM 1.5, 100 $mW/cm^2$ was continuously directed onto the solar cell over a long period (550 hours), the stabilized efficiency was 8.0%

An amorphous silicon solar cell which was obtained without using hydrogen gas as dilution gas under the same conditions except for this exhibited the photoelectric conversion efficiency and the stabilized efficiency similar to those described above.

Comparative Example 1

An amorphous silicon solar cell having the structure shown in FIG. 1 as similarly fabricated. Those conditions of deposition except for the condition regarding i type photoelectric conversion layer 112 were identical to those in Experimental Example 1.

An amorphous silicon photoelectric conversion layer 112 was deposited by diode parallel plate plasma enhanced CVD on conditions that the temperature of an underlayer was 180° C., the pressure in the reaction chamber was 0.1 Torr, the flow rate of silane gas per a unit electrode area was 0.06 $sccm/cm^2$ and no hydrogen gas was used, the discharge power density was 15 $mW/cm^2$, and the film deposition rate was 6 nm/min.

When light 3 with a quantity of AM 1.5, 100 $mW/cm^2$ was made incident onto the amorphous silicon solar cell, the efficiency of photoelectric conversion was 10.6% After the light with a quantity of AM 1.5, 100 $mW/cm^2$ was continuously directed onto the solar cell over a long period (550 hours), the stabilized efficiency was 8.0% which is almost equal to that in Experimental Example 1.

Compared with Experimental Example 1, the efficiency in the use of silane gas was remarkably degraded since the flow rate of the silane gas was doubled and the deposition time was 3.3 times longer.

According to the method of manufacturing an amorphous silicon-based thin film photoelectric conversion device of the invention, the conditions of the dilution, pressure, and distance between electrodes are defined to be within predetermined ranges such that plasma can efficiently be confined between the electrodes. Accordingly, the film deposition rate is enhanced and the efficiency in the use of the raw material gas such as silane-type gas is improved to reduce the manufacturing cost of the amorphous silicon-based thin film photoelectric conversion device. Further, a resultant performance is similar to that of the photoelectric conversion device (e.g. solar cell) fabricated by the conventional method, and degradation of the photoelectric conversion property due to exposure to the light over a long period, i.e. the rate of light degradation can be reduced.

The condition that the flow rate of the dilution gas is four or less times that of the silane-type gas is defined in order to prevent reduction in amount of the raw material gas within the reaction chamber and thus prevent decrease in the film deposition rate as observed in the conventional method if the flow rate is more than four times.

The condition that the partial pressure of the silane-type gas ranges from 1.2 Torr to 5.0 Torr is defined to avoid an insufficient amount of the raw material gas within the reaction chamber leading to decrease in deposition rate as observed if the partial pressure is less than 1.2 Torr, and prevent generation of a large amount of powder-like products and dust within the reaction chamber as observed if the partial pressure exceeds 5.0 Torr.

The condition that the distance between electrodes ranges from 8 mm to 15 mm is defined to avoid difficulty in plasma discharging and in implementing a constant distance between the electrodes over the electrode surfaces and thus prevent nonuniform deposition over the surfaces as observed if the distance is less than 8 mm. If the distance exceeds 15 mm, discharging cannot be maintained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing an amorphous silicon-based thin film photoelectric conversion device having a stacked structure composed of a p type semiconductor layer, an i type amorphous silicon-based photoelectric conversion layer, and an n type semiconductor layer by plasma CVD, wherein at least one layer of said p type semiconductor layer, said I type amorphous silicon-based photoelectric conversion layer, and said n type semiconductor layer is formed on conditions that silane-type gas as a main component of raw material gas which is supplied into a plasma CVD reaction chamber and dilution gas containing hydrogen are used, flow rate of the dilution gas is at most four times that of said silane-type gas, partial pressure of the silane-type gas in said plasma CVD reaction chamber ranges from 1.2 Torr to 5.0 Torr, and the distance between a surface of a substrate mounted on one electrode and a surface of the other electrode opposed to said one electrode ranges from 8 mm to 15 mm, and the flow rate of said silane-type gas per a unit area of the surface of said electrode is at most 0.05 sccm/cm$^2$.

2. The method of manufacturing an amorphous silicon-based thin film photoelectric conversion device according to claim 1, wherein film deposition rate of said layer formed under said conditions is at least 12 nm/min.

3. The method of manufacturing an amorphous silicon-based thin film photoelectric conversion device according to claim 1, wherein said one electrode is an anode electrode which is heated during deposition and said other electrode is a cathode electrode.

4. A method of manufacturing an amorphous silicon-based thin film photoelectric conversion device having a stacked structure composed of a p type semiconductor layer, an i type amorphous silicon-based photoelectric conversion layer, and an n type semiconductor layer by plasma CVD, wherein at least one layer of said p type semiconductor layer, said i type amorphous silicon-based photoelectric conversion layer, and said n type semiconductor layer is formed on conditions that silane-type gas as a main component of raw material gas which is supplied into a plasma CVD reaction chamber is used without using dilution gas, partial pressure of the silane-type gas in said plasma CVD reaction chamber ranges from 1.2 Torr to 5.0 Torr, and the distance between a surface of a substrate mounted on one electrode and a surface of the other electrode opposed to said one electrode ranges from 8 mm to 15 mm.

5. The method of manufacturing an amorphous silicon-based thin film photoelectric conversion device according to claim 4, wherein the flow rate of said silane-type gas per a unit area of the surface of said electrode is at most 0.05 sccm/cm$^2$.

6. The method of manufacturing an amorphous silicon-based thin film photoelectric conversion device according to claim 4, wherein film deposition rate of said layer formed under said conditions is at least 12 nm/min.

7. The method of manufacturing an amorphous silicon-based thin film photoelectric conversion device according to claim 4, wherein said one electrode is an anode electrode which is heated during deposition and said other electrode is a cathode electrode.

* * * * *